United States Patent [19]

Kandori et al.

[11] Patent Number: 5,688,326
[45] Date of Patent: Nov. 18, 1997

[54] APPARATUS FOR COATING ELONGATED MATERIAL WITH PHOTORESIST

[75] Inventors: Takefumi Kandori; Jyouitsu Sawa; Toshimasa Takeuchi, all of Hikone, Japan

[73] Assignee: Dainippon Screen Mfg. Co., Ltd., Japan

[21] Appl. No.: 544,731

[22] Filed: Oct. 18, 1995

[30] Foreign Application Priority Data

Nov. 18, 1994 [JP] Japan ................................ 6-309913

[51] Int. Cl.⁶ ........................................... B05C 3/12
[52] U.S. Cl. ........................ 118/419; 118/407; 118/423
[58] Field of Search ................................. 118/304, 314, 118/325, 407, 419, 423; 427/271, 278, 359

[56] References Cited

FOREIGN PATENT DOCUMENTS

| | | |
|---|---|---|
| 61-96085 | 5/1986 | Japan . |
| 62-15242 | 4/1987 | Japan . |
| 63-175159 | 11/1988 | Japan . |
| 6-240500 | 8/1994 | Japan . |

*Primary Examiner*—Donald E. Czaja
*Assistant Examiner*—Steven B. Leavitt
*Attorney, Agent, or Firm*—Ostrolenk, Faber, Gerb & Soffen, LLP

[57] ABSTRACT

An elongated material treatment apparatus includes, a coating device for coating a photoresist on a main region in a principal surface of an elongated material with a photoresist, and a conveying device for transporting the elongated material from a cleaning device to the coating device while supporting a transport support region in the principal surface cleaned by the cleaning device, there is a cleaning fluid removing device between the cleaning device and the coating device for removing a cleaning fluid deposited on the transport support region, whereby the elongated material is prevented from slipping during the transport of the elongated material by the conveying device and is correctly transported. The elongated material is transported to the coating device, with the cleaning fluid left in the main region, permitting uniform coating of the photoresist on the main region.

18 Claims, 6 Drawing Sheets

APPARATUS FOR COATING ELONGATED MATERIAL WITH PHOTORESIST

BACKGROUND OF THE INVENTION

1. Field of the Invention

The present invention relates to an elongated material treatment apparatus for cleaning an elongated material being transported in its longitudinal direction and then coating a principal surface of the elongated material with a photoresist. More particularly, the invention relates to an elongated material treatment apparatus for use in fabrication of shadow masks and aperture grills for color CRTs, lead frames for semiconductor devices and printed boards by using the photoetching technique.

2. Description of the Background Art

In general, shadow masks and aperture grills used for color CRTs are fabricated by the photoetching technique. The photoetching process comprises the steps of cleaning opposite principal surfaces of an elongated material such as a web while transporting the elongated material in its longitudinal direction (cleaning treatment), and then forming a photoresist film on the cleaned principal surfaces (coating treatment). The elongated material involves a material (web) having a thickness of about 30 µm to about 300 µm and made of low carbon aluminum-killed steel or invar alloy (ferric-nickel alloy containing 36% of nickel).

FIG. 7 is a schematic side view of a conventional treatment apparatus for cleaning and coating the elongated material. This apparatus comprises a degreasing device 52 for removing oil deposited on opposite principal surfaces of an elongated material 51 being transported in its longitudinal direction, a first cleaning device 53 for cleaning the degreased elongated material 51, a smoothing device 54 for removing a surface oxide deposited on the opposite principal surfaces of the elongated material 51, a second cleaning device 55 for cleaning the smoothed elongated material 51, a coating device 57 for applying a photoresist on the opposite principal surfaces of the cleaned elongated material 51, and a drying device 58 for drying the photoresist coated on the elongated material 51.

The degreasing device 52 FIG. 7 removes oil such as anticorrosive oil and rolling oil applied to the opposite principal surfaces of the elongated material 51 during the fabrication of the elongated material 51. A degreasing bath 59 stores therein a degreasing agent 72 containing sodium silicate and a surface active agent. A pair of first liquid removing rollers 60 are cylindrical liquid-absorbing sponge rollers adjacent the exit of the degreasing device 52 and adapted to hold the elongated material 51 therebetween for removing the degreasing agent 72 deposited on the elongated material 51 to prevent the degreasing agent 72 from being carried out of the degreasing bath 59.

The first cleaning device 53 comprises a plurality of first shower nozzles 62 for spraying water, serving as a cleaning fluid, on the elongated material 51 to clean the elongated material 51. A first cleaning bath 61 receives the cleaning fluid dropped from the elongated material 51 and prevents splashing of the cleaning fluid therearound. A pair of second liquid removing rollers 63 which are similar in construction to the first liquid removing rollers 60 remove the cleaning fluid deposited on the elongated material 51 to prevent the cleaning fluid from being carried out of the first cleaning bath 61.

The smoothing device 54 removes the oxide film from the principal surfaces of the elongated material 51. A smoothing bath 64 stores a smoothing agent 73 such as a phosphoric acid solution, a hydrochloric acid solution, a nitric acid solution, and a sodium hydroxide solution. A pair of third liquid removing rollers 65, which are similar in construction to the first liquid removing rollers 60, remove the smoothing agent 73 deposited on the elongated material 51 to prevent the smoothing agent 73 from being carried out of the smoothing bath 64.

The second cleaning device 55 comprises a plurality of second shower nozzles 67 for spraying water, serving as a cleaning fluid, on the elongated material 51 to clean the elongated material 51. A second cleaning bath 66 receives the cleaning fluid dropped from the elongated material 51 and prevents splashing of the cleaning fluid therearound.

A conveying device 56 is located between the second cleaning device 55 and the coating device 57 to transport the elongated material 51 from the second cleaning device 55 to the coating device 57. A tension roller 74 is provided to apply predetermined tension to the elongated material 51. A first drive roller 71a is rotated by a rotary means (not shown) about its axis in a counterclockwise direction as viewed in FIG. 7. A second drive roller 71b is rotated by a rotary means (not shown) about its axis in a clockwise direction as viewed in FIG. 7.

The coating device 57 immerses the elongated material 51 in a photoresist 75 to coat the photoresist 75 on the opposite principal surfaces of the elongated material 51. A photoresist bath 68 stores therein the water-soluble photoresist 75 consisting of casein and bichromate. A pair of squeegee rollers 69 are of cylindrical configuration with a plurality of grooves formed in their surfaces and provided adjacent the liquid level of the photoresist 75 stored in the photoresist bath 68. The squeegee rollers 69 hold the elongated material 51 drawn up from the photoresist 75 therebetween to scrape off excess photoresist 75 deposited on the principal surfaces of the elongated material 51 for uniformity of the photoresist 75 deposited on the elongated material 51.

The drying device 58 dries the photoresist 75 coated on the elongated material 51 by a hot air or infrared heater (not shown) to form a photoresist film having a thickness of several micrometers.

A plurality of transport rollers 70 are provided in the degreasing device 52, first cleaning device 53, smoothing device 54, second cleaning device 55, and coating device 57 to correctly introduce the elongated material 51 to the respective devices.

The first drive roller 71a, second drive roller 71b, transport rollers 70, and tension roller 74, as disclosed in Japanese Utility Model Publication No. 62-15242 (1987), do not contact a middle portion (referred to hereinafter as a "main region") of the principal surfaces of the elongated material 51 but support only opposite end portions in the direction of width which is perpendicular to the its longitudinal direction. These supported areas are disposed along opposite longitudinal edges of material 51. This achieves the transport of the elongated material 51 without damages to or contamination in the main region of the elongated material 51. The opposite widthwise end portions which contact the rollers 70, 71a, 71b, 74 are referred to hereinafter as "transport support regions."

In the arrangement of FIG. 7, however, the cleaning fluid applied to the opposite principal surfaces of the elongated material 51 by the second cleaning device 55 remains deposited on the transport support regions of the elongated material 51 fed to the transport device 56. This deposited cleaning fluid causes slip in contact portions between the transport support regions and the first and second rollers 71a, 71b, resulting in inaccurate transport of the elongated material 51.

A solution to the slip problem is to provide liquid removing rollers identical with the first liquid removing rollers 60 adjacent the exit of the second cleaning device 55 to entirely remove the cleaning fluid deposited over the principal surfaces of the elongated material 51. However, the removal of the cleaning fluid from the main region of the elongated material 51 by the liquid removing rollers causes another problem to arise. That is, bubbles are generated in the main region of the elongated material 51 immersed in the photoresist 75 in the coating device 57, resulting in non-uniform coating of the photoresist 75.

SUMMARY OF THE INVENTION

The present invention is directed to an elongated material treatment apparatus for cleaning a principal surface of an elongated material, the principal surface comprising a main region and a transport support region, and then coating the main region in the cleaned principal surface with a photoresist. The elongated material treatment apparatus comprises: cleaning means for applying a cleaning fluid to the whole of a principal surface of an elongated material to clean the principal surface, and coating means for coating the cleaned principal surface with a photoresist. Conveying means disposed between the cleaning means and the coating means transports the elongated material from the cleaning means to the coating means while supporting a transport support region in the principal surface. Cleaning fluid removing means disposed between the cleaning means and the conveying means removes the cleaning fluid deposited on the transport support region.

It is therefore an object of the present invention to provide an elongated material treatment apparatus which is capable of cleaning an elongated material and then uniformly coating a main region of the elongated material with a photoresist.

These and other objects, features, aspects and advantages of the present invention will become more apparent from studying the following detailed description of the present invention when taken in conjunction with the accompanying drawings.

DESCRIPTION OF THE PREFERRED EMBODIMENTS

One preferred embodiment according to the present invention will now be described with reference to FIGS. 1, 2 and 3, wherein FIG. 1.

Figure 7:
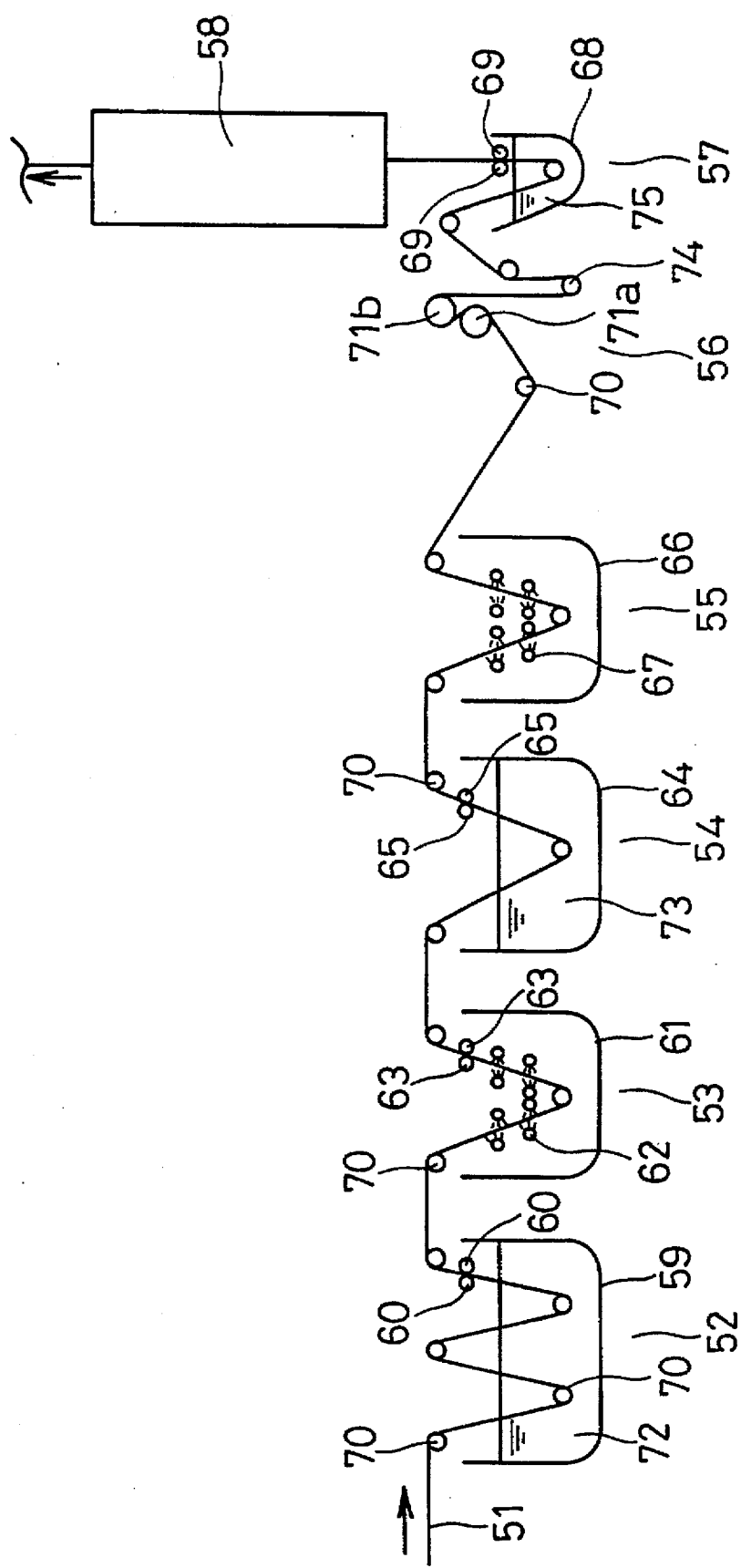
FIG. 7 is a schematic side view of a conventional treatment apparatus for cleaning and coating an elongated material.

Is a schematic side view of one preferred embodiment according to the present invention. For the apparatus of FIG. 1, the degreasing device 52, first cleaning device 53, and smoothing device 54 of FIG. 7 are provided on the upstream side (on the left-hand side of FIG. 1) with respect to a cleaning device 1 in a transport direction of an elongated material 5 indicated by the arrows, and the drying device 58 of FIG. 7 is provided on the downstream side (on the right-upper side of FIG. 1) with respect to a coating device 2 in the transport direction.

Figure 1:
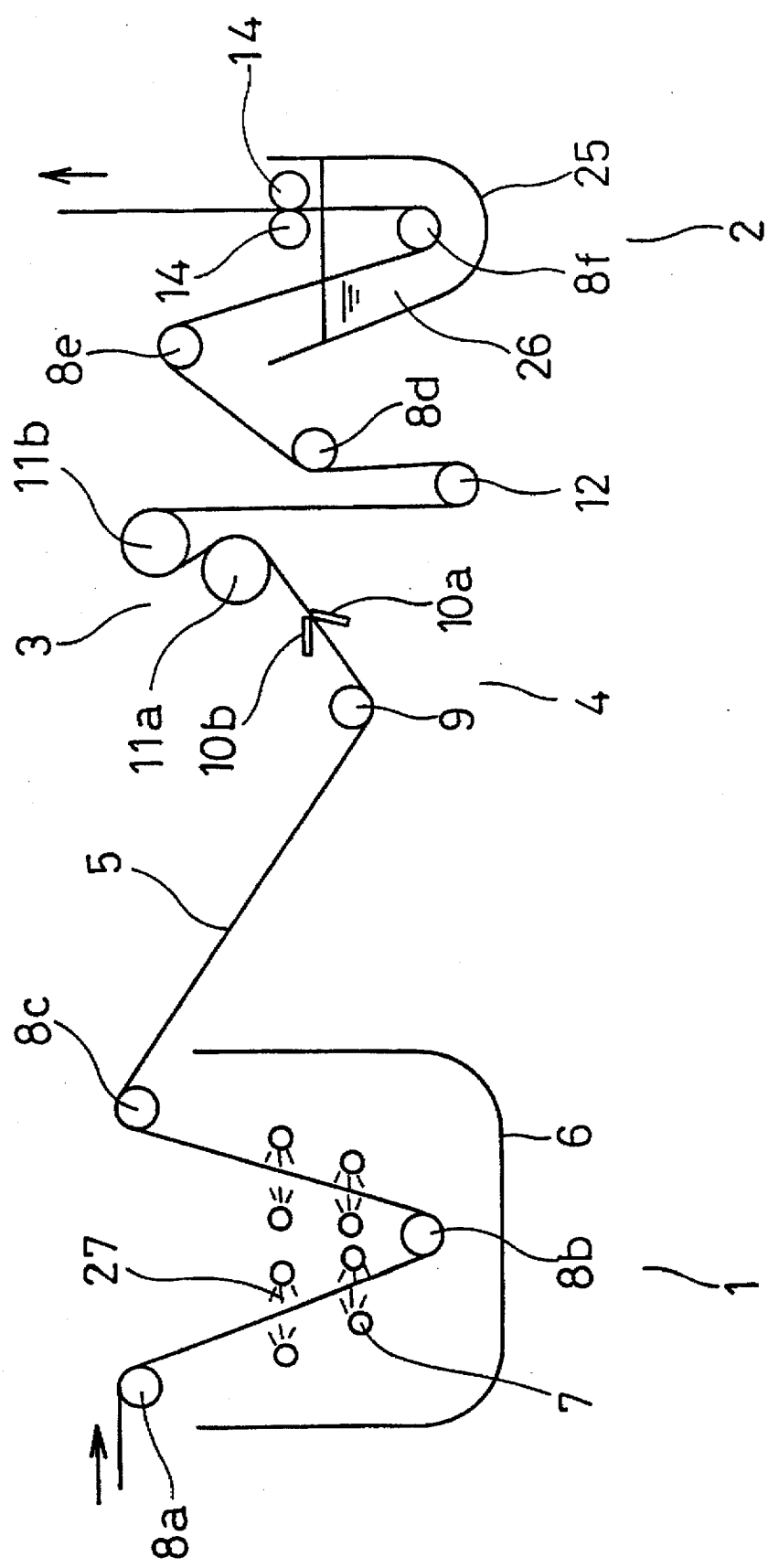
FIG. 1 is a schematic side view of apparatus embodying one preferred embodiment according to the present invention.

The elongated material 5 in FIG. 1 is an elongated, thin metal sheet (web) having a thickness of about 30 µm to 300 µm and made of low-carbon aluminum-killed steel or invar alloy (ferric-nickel alloy containing 36% of nickel).

The cleaning device 1 applies a cleaning fluid to the whole of the principal surfaces of the elongated material 5 to clean the principal surfaces of the elongated material 5. A plurality of shower nozzles 7 direct jets of water 27 serving as a cleaning fluid toward opposite principal surfaces of the elongated material 5. A cleaning bath 6 receives the cleaning fluid dropped from the elongated material 5 and prevents splashing of the cleaning fluid jetted out of the shower nozzles 7 therearound. Transport rollers 8a, 8b, 8c are arranged in V-shaped configuration in side elevation. Each of the transport rollers 8a, 8b, 8c supports opposite widthwise end portions of the elongated material 5 so that the principal surfaces of the elongated material 5 may be levelled, and is rotated about its axis as the elongated material 5 is fed.

The coating device 2 applies a water-soluble photoresist 26 consisting of, for example, casein and bichromate to the principal surfaces of the elongated material 5 cleaned by the cleaning device 1. A photoresist bath 25 stores the photoresist 26 therein. A pair of squeegee rollers 14 are of cylindrical configuration with a plurality of grooves formed in their surfaces and provided adjacent the liquid level of the photoresist 26 stored in the photoresist bath 25 to hold the elongated material 5 therebetween. Each of transport rollers 8d, 8e, 8f is rotated about its axis as the elongated material 5 is fed, while supporting the opposite widthwise end portions of the elongated material 5 so that the principal surfaces of the elongated material 5 may be levelled, to introduce the elongated material 5 into the photoresist bath 25.

A conveying device 3 comprises a first drive roller 11a and a second drive roller 11b and transports the elongated material 5 from the cleaning device 1 to the coating device 2. The first drive roller 11a supports the opposite widthwise end portions of the upper principal surface having a width of about 20 mm from the edges of the elongated material 5 in the direction of width (referred to hereinafter "widthwise edges"), that is, transport support regions so that the principal surfaces of the elongated material 5 may be levelled, and is rotated by a rotary means (not shown) such as a motor about its axis in a counterclockwise direction as viewed in FIG. 1. The second drive roller 11b supports the opposite widthwise end portions of the lower principal surface having a width of about 20 mm from the widthwise edges, that is, transport support regions so that the principal surfaces of the elongated material 5 may be levelled, and is rotated by a rotary means (not shown) such as a motor about its axis in a clockwise direction as viewed in FIG. 1. The first and second drive rollers 11a and 11b are arranged to curve the elongated material 5 into S-shaped configuration in side elevation.

A tension roller 12 receives a downward force by an urging mechanism (not shown) to apply predetermined tension to the elongated material 5.

A cleaning fluid removing device 4 removes water as a cleaning fluid deposited on the transport support regions in the principal surfaces of the elongated material 5 to be supported by the conveying device 3. A support roller 9 supports the transport support regions of the elongated material 5 from the upper principal surface thereof and is rotated about its axis as the elongated material 5 is fed. A first doctor blade 10a abuts against the transport support region in the lower principal surface of the elongated material 5 to scrape off the water deposited on the transport support region. A second doctor blade 10b abuts against the transport support region in the upper principal surface of the elongated material 5 to scrape off the water deposited on the transport support region. The first and second doctor blades 10a, 10b are supported by a shaft of the support roller 9 and have a sharp forward end abutting against the elongated material 5. The first and second doctor blades 10a, 10b have a width of about 20 mm and a thickness ranging from 0.15 mm to 3 mm, and are made of metal or plastic such as polyamide, PVC (polyvinyl), chloride), polyester.

The cleaning fluid removing device 4 employed in one preferred embodiment according to the present invention will be described in detail with reference to FIGS. 2 and 3, with FIG. 2 being a schematic perspective of the cleaning fluid removing device 4, and FIG. 3 being a side view of the cleaning fluid removing device 4 of FIG. 2.

Figure 2:
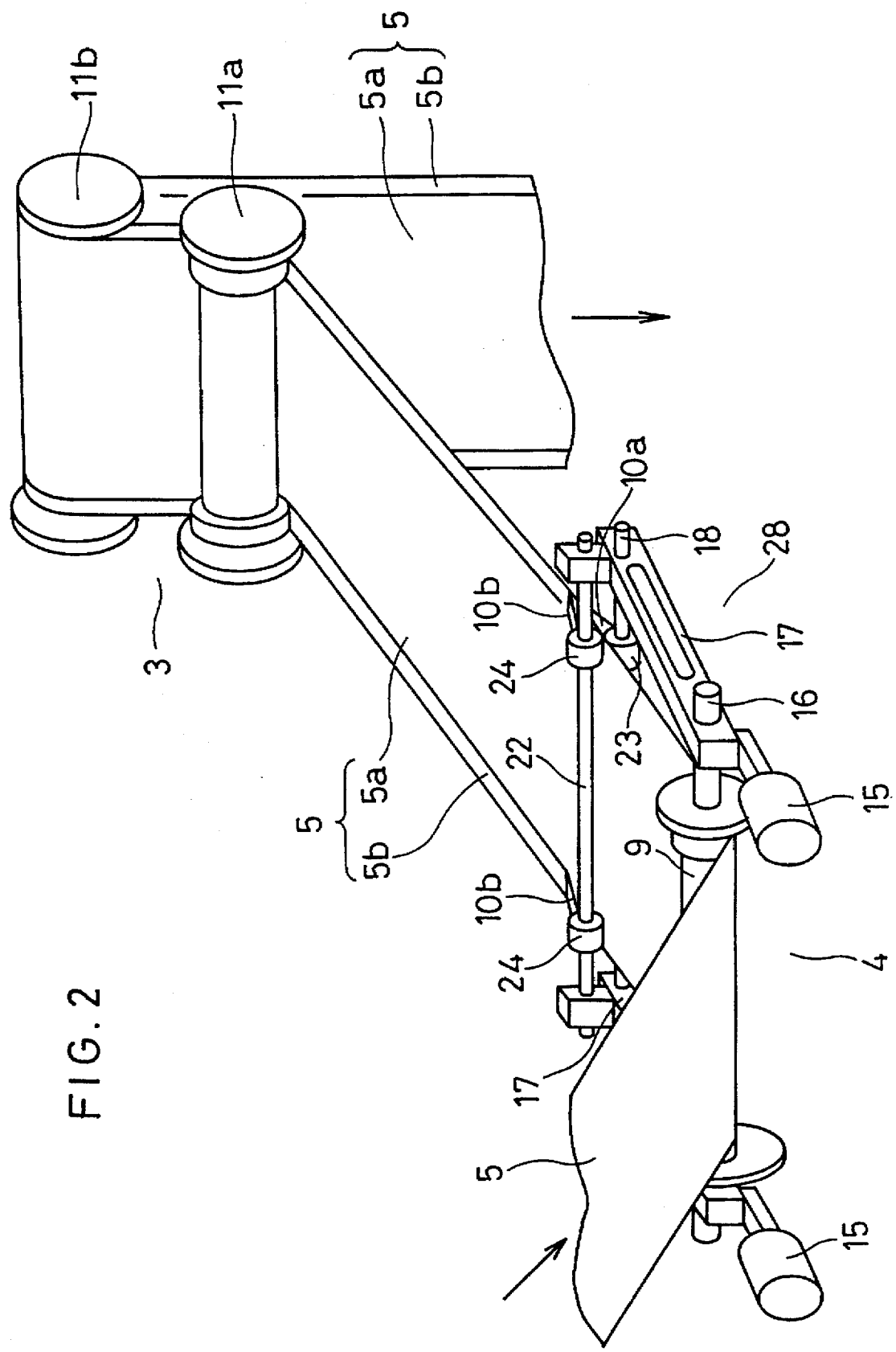
FIG. 2 is a schematic perspective of a cleaning fluid removing device employed in one preferred embodiment according to the present invention.

Referring to FIG. 2, the first doctor blade 10a, the second doctor blade 10b, and a biasing or urging mechanism 28 for urging the first doctor blade 10a toward the lower principal surface side of the elongated material 5 are located in corresponding relation to each of the opposite transport support regions of the elongated material 5 in the cleaning fluid removing device 4. The urging mechanism 28 comprises a fixed shaft 16, mounting members 17, weights 15, a first mounting shaft 18, and first retentive members 23. The fixed shaft 16 is a shaft for the support roller 9 and is fixed by a securing means (not shown). The support roller 9 is mounted rotatably relative to the fixed shaft 16.

Figure 3:
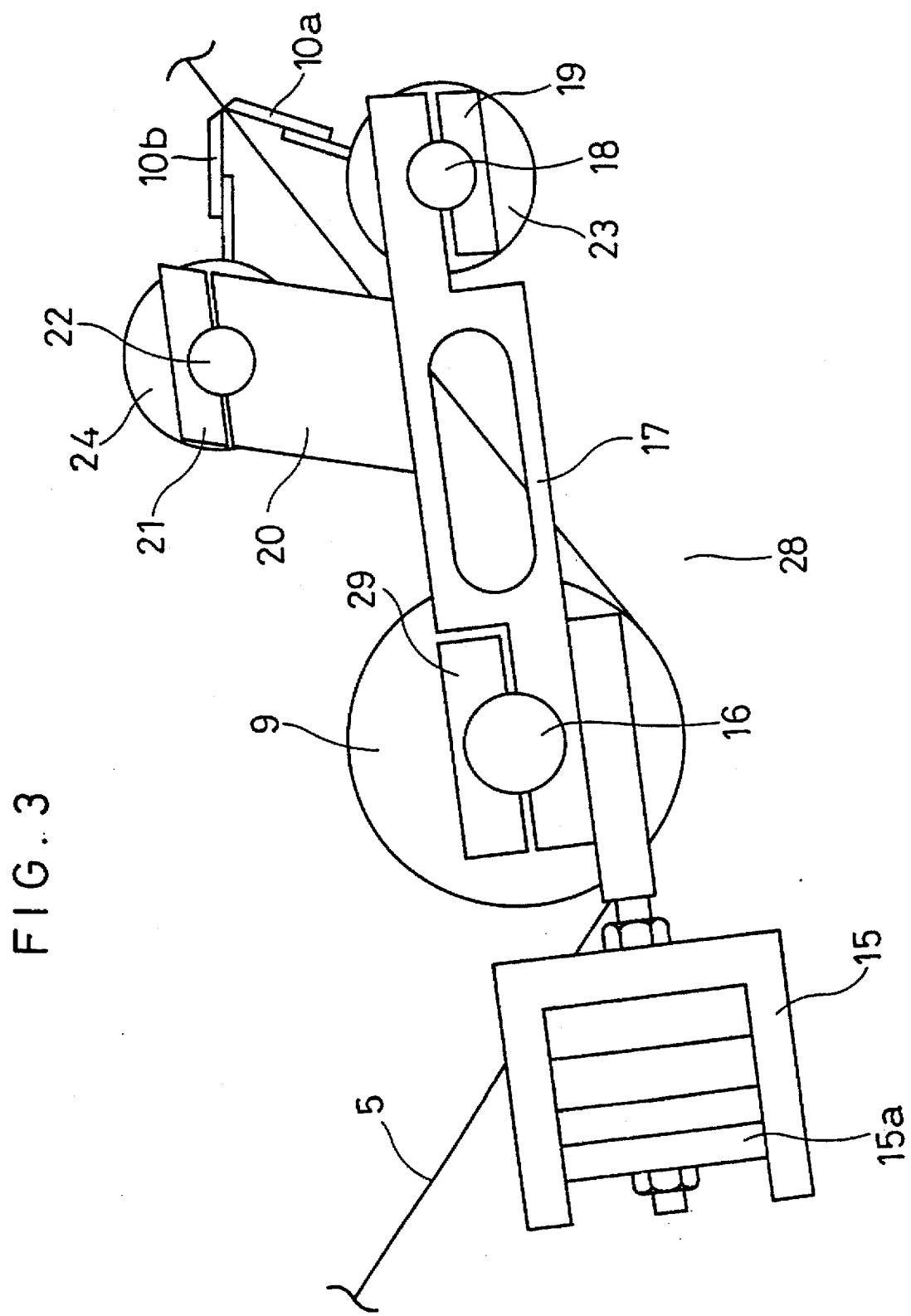
FIG. 3 is a side elevation of the cleaning fluid removing device of FIG. 2.

With reference to FIG. 3, a first end of the mounting member 17 and a first mounting block 29 hold the fixed shaft 16 therebetween, and the mounting member 17 is mounted rotatably relative to the fixed shaft 16. The weight 15 is mounted to the first end of the mounting member 17 to apply an upward force to the first doctor blade 10a through the mounting member 17 around the fixed shaft 16. The weight 15 includes a plurality of removable weight elements 15a and is weight-variable by increasing or decreasing the number of weight elements 15a to control the force applied to the first doctor blade 10a. When the weight 15 is heavy in weight, a great force urges the first doctor blade 10a to bend or damage the transport support regions in the principal surfaces of the elongated material 5 against which the first doctor blade 10a abuts. In this case, the number of weight elements 15a of the weight 15 may be decreased to reduce the force applied to the first doctor blade 10a, preventing the transport support regions from being bent or damaged. When the weight 15 is light in weight, the total weight of the components from the fixed shaft 16 to the first doctor blade 10a is heavier than that of the components from the fixed shaft 16 to the weight 15. The result is the downward movement of the first doctor blade 10a which then is not permitted to abut against the transport support regions in the principal surfaces of the elongated material 5. In this case, the number of weight elements 15a of the weight 15 is increased to increase the upward force applied to the first doctor blade 10a, thereby forcing the first doctor blade 10a to abut against the transport support regions. In this preferred embodiment, the weight of the weight 15 is controlled by increasing or decreasing the number of weight elements 15a so that the total weight of the components from the fixed shaft 16 to the weight 15 is 5 kg heavier than that of the components from the fixed shaft 16 to the first doctor blade 10a.

The first mounting shaft 18 is fixed to a second end of the mounting member 17 by a second mounting block 19. The first doctor blade 10a is mounted to the first retentive member 23 which in turn is mounted rotatably about the first mounting shaft 18 by an adjusting means (not shown). The rotation of the first retentive member 23 about the first mounting shaft 18 adjusts the angle at which the first doctor blade 10a abuts against the elongated material 5.

The second doctor blade 10b is secured to a second retentive member 24 which in turn is fixed to a second mounting shaft 22. The second mounting shaft 22 is securely held between a third mounting block 20 fixed to the mounting member 17 and a fourth mounting block 21. The angle at which the second doctor blade 10b abuts against the elongated material 5 may be adjusted by rotating the second mounting shaft 22, second retentive member 24 and second doctor blade 10b integrally about the axis of the second mounting shaft 22.

During operation of the above stated preferred embodiment (FIG. 1–3).

Elongated material 5, while being transported in its longitudinal direction, is subjected to spraying of water as the cleaning fluid by the plurality of shower nozzles 7 in the cleaning device 1 and cleaned over its principal surfaces. Then, in the cleaning fluid removing device 4, the cleaning fluid deposited on the transport support regions in the principal surfaces (opposite widthwise end portions having a width of about 20 mm from the widthwise edges) of the elongated material 5 is scraped with the first doctor blades 10a abutting against the transport support regions in the lower principal surface of the elongated material 5 and the transport support region for upper principal surface of material 5 is scraped with second doctor blades 10b abutting against the transport support regions in the upper principal surface thereof. This allows the cleaning fluid on the transport support regions 5b to be removed, with the cleaning fluid on the main regions 5a left unremoved, on the opposite principal surfaces of the elongated material 5 fed out of the cleaning fluid removing device 4 as shown in FIG. 2.

In accordance with operation of to the cleaning fluid removing device 4, the urging mechanism 28 urges the first doctor blades 10a upwardly, or toward the lower principal surface of the elongated material 5 against which the first doctor blades 10a abut, permitting the first doctor blades 10a to constantly abut against the lower principal surface of the elongated material 5, even if the elongated material 5 snakes up and down. The second doctor blades 10b which are opposed to the first doctor blades 10a, with the elongated material 5 therebetween, constantly abut against the upper principal surface of the elongated material 5.

The elongated material 5 fed from the cleaning fluid removing device 4 is supported in its transport support regions 5b from which the cleaning fluid is scraped off by the cleaning fluid removing device 4 and curved into S-shaped configuration, as viewed in side elevation, by the first and second drive rollers 11a and 11b of the conveying device 3 and is then transported to the coating device 2. In this fashion, since the elongated material 5 is transported by using the transport support regions 5b from which the cleaning fluid is removed, the treatment apparatus of the above preferred embodiment transports the elongated material 5 correctly without slip of the elongated material 5.

The elongated material 5 fed to the coating device 2 is immersed in the photoresist 26 stored in the photoresist bath 25 and then drawn up therefrom. In this preferred embodiment, since the cleaning fluid is removed from the transport support regions 5b by the cleaning fluid removing device 4 but remains unremoved in the main regions 5a, the photoresist 26 is applied to the main regions 5a without the generation of bubbles in the main regions 5a. The elongated material 5 drawn up from the photoresist 26 is subjected to scraping of excess photoresist 26 deposited on its principal surfaces by the squeegee rollers 14 abutting against the principal surfaces adjacent the liquid level of the photoresist 26. This provides the elongated material 5 which has its principal surfaces coated uniformly with the photoresist 26.

Modifications of the present invention will be described below. In the modifications to be described below, reference numerals and characters identical with those of the preferred embodiment (FIGS. 1–3) are used to designate components having identical functions.

Figure 4:
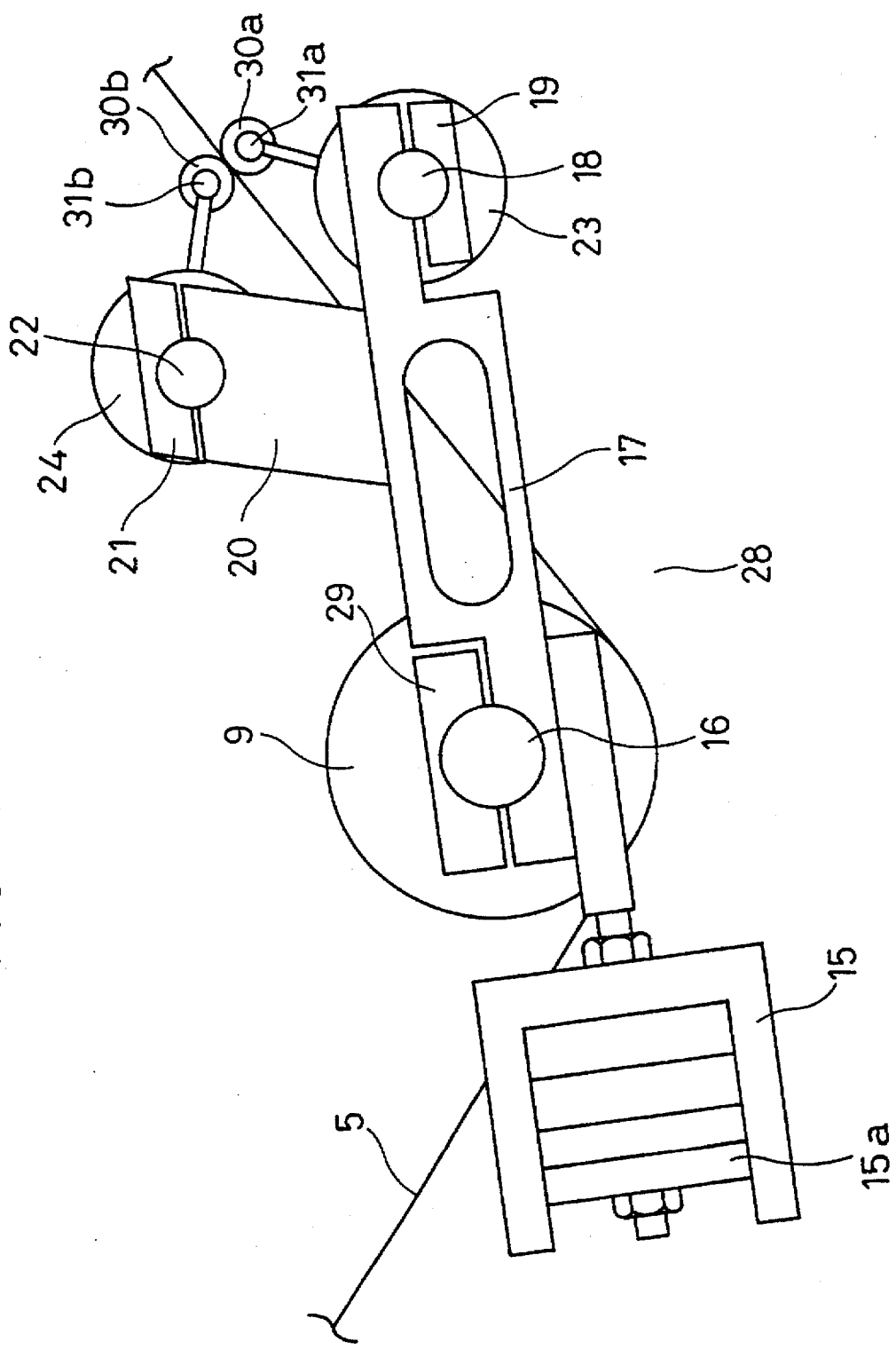
FIG. 4 is a side elevation of a modification of the present invention.

(1) The first and second doctor blades 10a, 10b are used as abutting members which abut against the elongated material in the cleaning fluid removing device in the above stated preferred embodiment, but may be replaced with liquid-absorbing members. FIG. 4 is a side view of a modification of the present invention, in which a first sponge roller 30a and a second sponge roller 30b are cylindrical liquid-absorbing members which abut against the transport support regions, having a width of about 20 mm, of the elongated material 5. The first sponge roller 30a is urged upwardly by the urging mechanism 28 and is mounted rotatably on a third mounting shaft 31a. The second sponge roller 30b is mounted rotatably on a fourth mounting shaft 31b. The third mounting shaft 31a and the fourth mounting shaft 31b are secured respectively to the first retentive member 23 and the second retentive member 24. The first and second sponge rollers 30a, 30b abut against the transport support regions having a width of about 20 mm from the widthwise edges to absorb the cleaning fluid deposited on the transport support regions while being rotated respectively about the third and fourth mounting shafts 31a, 31b as the elongated material 5 is fed.

Figure 5:
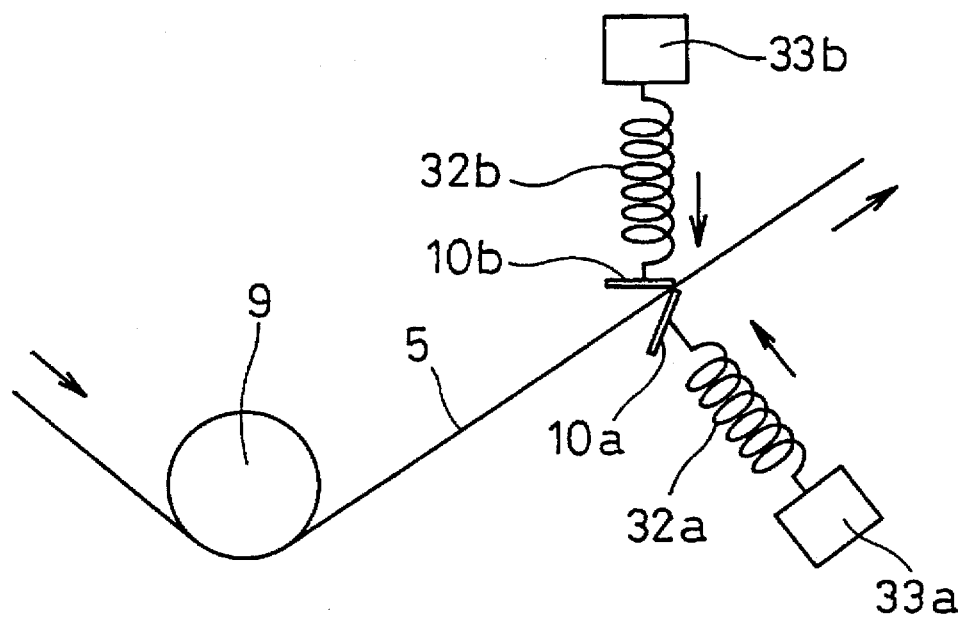
FIG. 5 is a schematic side view of another modification of the present invention.

(2) The urging mechanism for urging the doctor blades may be constructed as shown in the schematic side view of FIG. 5 of the urging mechanism of wherein the first doctor blade 10a and second doctor blade 10b are mounted respectively to an elastic first spring 32a and an elastic second spring 32b which in turn are secured respectively to a first fixed member 33a and a second fixed member 33b. The first and second doctor blades 10a, 10b are urged toward the abutting principal surfaces of the elongated material 5 by the elastic force of the first and second springs 32a, 32b, respectively.

Figure 6:
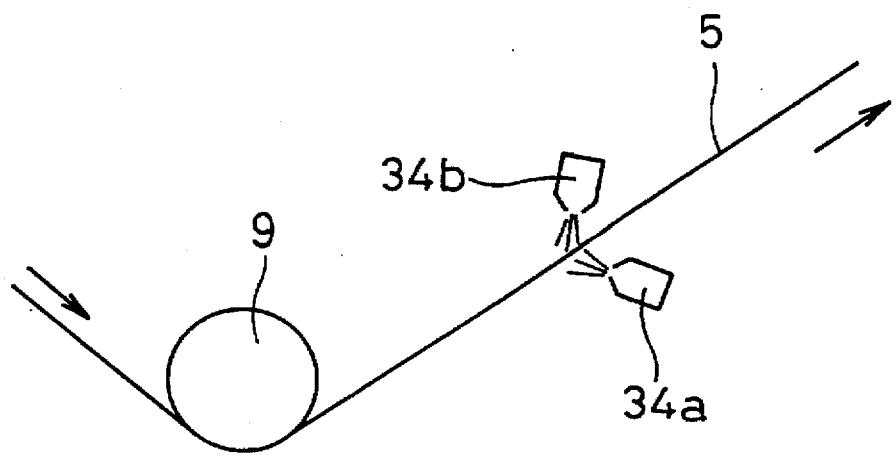
FIG. 6 is a schematic side view of still another modification of the present invention.

(3) FIG. 6 Illustrates a modification wherein nozzles 34a, 34b for blowing air toward the transport support regions of the elongated material 5 may be used as cleaning fluid removing means. First nozzle 34a directs an air strum toward the transport support region in the lower principal surface of the elongated material 5 to blow away the cleaning fluid deposited on the transport support region thereof. Second nozzle 34b directs an air stream toward the transport support region in the upper principal surface of the elongated material 5 to blow away the cleaning fluid deposited on the transport support region thereof.

(4) The method of conveying the elongated material 5 is not limited to that of the above stated preferred embodiment.

As disclosed in Japanese Patent Application Laid-Open No. 61-96085 (1986), the elongated material 5 may be transported in its longitudinal direction while being supported so that its principal surfaces are orthogonal to the horizontal plane.

(5) The cleaning fluid is removed from the transport support regions 5b which are the opposite widthwise end portions in the principal surfaces of the elongated material 5 in the above stated preferred embodiment. However, one of the longitudinal end portions may be defined as the transport support region which is subjected to the cleaning fluid removal and then supported by the conveying device for transport of the elongated material.

In recent years, there has been a tendency to reduce the thickness of shadow masks and aperture grills for purposes of reducing the weight of the color CRTs and preventing partial thermal deformation (doming effect) of the shadow masks and aperture grills struck by electron beams emitted from the electron guns in the color CRTs. The elongated material for the shadow masks and aperture grills have employed a very thin metal sheet having a thickness ranging from 30 μm to 100 μm. The treatment of this elongated material by the conventional elongated material treatment apparatus shown in FIG. 7 is prone to cause slip particularly in the contact portions (transport support regions) between the elongated material 51 and the first and second drive rollers 71a, 71b, resulting in inaccurate transport of the elongated material 51 from the second cleaning device 55 to the coating device 57. This results from the fact that the tension roller 74 must apply lower tension to the elongated material 51 having a smaller thickness than to that having a greater thickness since the elongated material 51 having a smaller thickness may become longer in its longitudinal direction and the elongated material 51 supported in its longitudinal end portions may be folded adjacent a widthwise middle position thereof.

However according to the elongated material treatment apparatus of the present invention, the cleaning fluid removing device 4 removes the cleaning fluid deposited on the transport support regions of the elongated material 5 to be supported by the conveying device 3. Thus, no slip occurs in the transport support regions 5b in which the first and second drive rollers 11a, 11b contact the elongated material 5 which may be as thin as 30 μm to 100 μm even if the tension roller 12 of FIG. 1 applies low tension to the elongated material 5. This allows correct transport of the elongated material 5 from the cleaning device 1 to the coating device 2.

While the invention has been shown and described in detail, the foregoing description is in all aspects illustrative and not restrictive. It is therefore understood that numerous modifications and variations can be devised without departing from the scope of the invention.

What is claimed is:

1. An elongated material treatment apparatus for treating an elongated material having a principal surface comprising a main region and a transport support region, said apparatus cleaning said principal surface to produce a cleaned principal surface and then coating said main region of said cleaned principal surface with a photoresist while transporting said elongated material in its longitudinal direction, said elongated material treatment apparatus comprising:

a coating device for coating said cleaned principal surface with a photoresist by immersing said elongated material in a photoresist bath and then drawing up said elongated material from said bath;

a cleaning device disposed just upstream of said coating device in a transport direction of said elongated material for applying a cleaning fluid to the whole of said principal surface to clean said principal surface to be coated with said photoresist by said coating device;

a conveying device disposed between said cleaning device and said coating device for transporting said elongated material from said cleaning device to said coating device while supporting said transport support region of said principal surface; and a cleaning fluid removing device disposed between said cleaning device and said conveying device for removing said cleaning fluid deposited on said transport support region without removing cleaning fluid that has been deposited on said main region.

2. The elongated material treatment of claim 1, wherein said cleaning fluid removing device comprises an abutting member for abutting against said transport support region of said cleaned principal surface when remaining clear of said main region.

3. The elongated material treatment apparatus of claim 2, wherein said cleaning fluid removing device further comprises an urging mechanism for urging said abutting member toward said principal surface.

4. The elongated material treatment apparatus of claim 3, wherein said elongated material is a sheet material having first and second principal surfaces to be cleaned and coated with a photoresist.

5. The elongated material treatment apparatus of claim 4, wherein said conveying device comprises a support member for supporting said elongated material so that said elongated material may be levelled, with said first principal surface of said elongated material positioned downside, and wherein said urging mechanism comprises:
a fixed shaft secured in a predetermined position;
a mounting member rotatably mounted to said fixed shaft so that said abutting member abuts against the transport support region of said first principal surface; and
a weight mounted to said mounting member for applying an upward force to said abutting member.

6. The elongated material treatment apparatus of claim 5, wherein said conveying device comprises:
a first drive roller rotated about its axis in a predetermined direction for supporting said transport support region of said first principal surface; and
a second drive roller rotated about its axis in a direction opposite to the direction of rotation of said first drive roller for supporting said transport support region of said second principal surface,
said first and second drive rollers being arranged to curve said elongated material into S-shaped configuration.

7. The elongated material treatment apparatus of claim 6, wherein the elongated material is an elongated, thin metal sheet having a thickness ranging from about 30 μm to about 100 μm.

8. The elongated material treatment apparatus of claim 7, wherein said abutting member is a doctor blade for scraping off said cleaning fluid deposited on said transport support region of said cleaned principal surface.

9. The elongated material treatment apparatus of claim 7, wherein said abutting member is a liquid-absorbing member for absorbing said cleaning fluid deposited on said transport support region of said cleaned principal surface.

10. The elongated material treatment apparatus of claim 3, wherein said urging mechanism comprises:
an elastic element mounted to said abutting member; and
a retentive member for holding said elastic element so that an elastic force of said elastic element urges said abutting member toward said principal surface against which said abutting member abuts.

11. The elongated material treatment apparatus of claim 10, wherein said abutting member is a doctor blade for scraping off said cleaning fluid deposited on said transport support region of said cleaned principal surface.

12. The elongated material treatment apparatus of claim 10, wherein said abutting member is a liquid-absorbing member for absorbing said cleaning fluid deposited on said transport support region of said cleaned principal surface.

13. The elongated material treatment apparatus of claim 2, wherein said abutting member is a doctor blade for scraping off said cleaning fluid deposited on said transport support region of said cleaned principal surface.

14. The elongated material treatment apparatus of claim 2, wherein said abutting member is a liquid-absorbing member for absorbing said cleaning fluid deposited on said transport support region of said cleaned principal surface.

15. The elongated material treatment apparatus of claim 1, wherein said cleaning fluid removing device comprises an air blowing nozzle for directing an air current toward said transport support region of said cleaned principal surface.

16. The elongated material treatment apparatus of claim 1, wherein said elongated material is a sheet material having first and second principal surfaces to be cleaned and coated with a photoresist.

17. The elongated material treatment apparatus of claim 10, wherein said conveying device comprises:
a first drive roller rotated about its axis in a predetermined direction for supporting said transport support region of said first principal surface while remaining clear of said main region of said first principal surface; and
a second drive roller rotated about its axis in a direction opposite to the direction of rotation of said first drive roller for supporting said transport support region of said second principal surface while remaining clear of said main region of said second principal surface,
said first and second drive rollers being arranged to curve said elongated material into S-shaped configuration.

18. The elongated material treatment apparatus of claim 10, wherein the elongated material is an elongated, thin metal sheet having a thickness ranging from about 30 μm to about 100 μm.

* * * * *